(12) United States Patent
Li (10) Patent No.: US 10,984,687 B2
(45) Date of Patent: Apr. 20, 2021

(54) FLEXIBLE DISPLAY SUBSTRATE AND FABRICATION METHOD THEREOF AND DISPLAY DEVICE (71) Applicants: Beijing BOE Display Technology Co., Ltd., Beijing (CN); BOE TECHNOLOGY GROUP CO., LTD., Beijing (CN)

(72) Inventor: Yanqiu Li, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 425 days.

(21) Appl. No.: 16/146,164

(22) Filed: Sep. 28, 2018

(65) Prior Publication Data
US 2019/0156709 A1    May 23, 2019

(30) Foreign Application Priority Data
Nov. 21, 2017 (CN) .......................... 201711164788.X (51) Int. Cl.
H01L 51/00 (2006.01)
G09F 9/30 (2006.01)
H01L 51/52 (2006.01)
H01L 51/50 (2006.01)
H01L 51/56 (2006.01)
H01L 33/40 (2010.01)

(52) U.S. Cl.
CPC ............. G09F 9/301 (2013.01); H01L 33/40 (2013.01); H01L 51/0097 (2013.01); H01L 51/5012 (2013.01); H01L 51/5092 (2013.01); H01L 51/5206 (2013.01); H01L 51/5221 (2013.01); H01L 51/56 (2013.01); H01L 51/0037 (2013.01); H01L 2251/301 (2013.01); H01L 2251/5338 (2013.01)

(58) Field of Classification Search
None
See application file for complete search history.

(56) References Cited

FOREIGN PATENT DOCUMENTS

| CN | 105489660 A | 4/2016 | |
|---|---|---|---|
| CN | 107326441 A | 11/2017 | |
| JP | 2009246179 | * 10/2009 | ............. H01L 33/30 |

(Continued)

OTHER PUBLICATIONS

Machine transition of JP2009246179, 20 pages, translation generated Jan. 2021. (Year: 2021).*

(Continued)

Primary Examiner — Robert S Loewe
(74) Attorney, Agent, or Firm — Thomas Horstemeyer, LLP (57) ABSTRACT The present disclosure provides a flexible display substrate and a fabrication method thereof and a display device. The flexible display substrate includes a plurality of light-emitting units. The light-emitting units include an anode, a rhenium disulfide hole injection layer arranged on the anode, a light-emitting layer arranged on the rhenium disulfide hole injection layer, a single-layered molybdenum disulfide electron injection layer arranged on the light-emitting layer, and a cathode arranged on the molybdenum disulfide electron injection layer.

16 Claims, 6 Drawing Sheets (56) References Cited

FOREIGN PATENT DOCUMENTS

TW          201813148 A      4/2018

OTHER PUBLICATIONS

Zhao et al. "Interlayer coupling in anisotropic/isotropic van der Waals heterostructures of ReS 2 and MoS 2 monolayers." Nano Research 9, No. 12 (2016): 3772-3780. (Year: 2016).*
Bellus et al. "Type-I van der Waals heterostructure formed by MoS 2 and ReS 2 monolayers." Nanoscale Horizons 2, No. 1 (2017): 31-36. (Year: 2017).*
Tongay et al. "Monolayer behaviour in bulk ReS 2 due to electronic and vibrational decoupling." Nature communications 5, No. 1 (2014): 1-6. (Year: 2014).*
Gutiérrez-Lezama et al. "Polarized Light-Emitting Diodes Based on Anisotropic Excitons in Few-Layer ReS2." Advanced Materials 32, No. 32 (2016): 045016. (Year: 2016).*
Dileep et al. "Layer specific optical band gap measurement at nanoscale in MoS2 and ReS2 van der Waals compounds by high resolution electron energy loss spectroscopy." Journal of Applied Physics 119, No. 11 (2016): 114309. (Year: 2016).*
Chinese Office Action dated Jan. 3, 2019 for application No. 201711164788.X.

* cited by examiner

FLEXIBLE DISPLAY SUBSTRATE AND FABRICATION METHOD THEREOF AND DISPLAY DEVICE

CROSS-REFERENCE

This application is based upon and claims priority to Chinese Patent Application No. 201711164788.X, filed on Nov. 21, 2017, the entire contents thereof are incorporated herein by reference.

TECHNICAL FIELD

The present disclosure relates to the field of semiconductors, and more particularly, to a flexible display substrate and a fabrication method thereof and a display device.

BACKGROUND

An organic light emitting diode (OLED) is an organic electroluminescent device, in which an organic light-emitting material is sandwiched between an anode and a cathode, and a voltage is applied to an organic thin film to emit light. The OLED not only can be used as a display device, but also can be used as an illuminating device.

In existing OLED technologies, film layers such as an ITO (anode), a hole injection layer, a hole transport layer, an electron blocking layer, a light-emitting layer, a hole blocking layer, an electron transport layer, an electron injection layer and so on are fabricated on a glass substrate to increase viscosity of an electrode and of an transport layer, to increase carrier injection contact and to balance injection of electrons and holes, such that the electrons and the holes can successfully recombine in the light-emitting layer to form excitons and emit light.

In conventional flexible displays, different types of double-layer or multilayer materials with atomic layers stacked are used as the electron injection layers and the hole injection layers. However, when the flexible displays are twisted, electrons and holes in these double-layer or multilayer materials are in different atomic layers, such that the electrons cannot easily find the holes, which causes low light emission efficiency and has a negative effect on electrical characteristics of the displays.

SUMMARY

Arrangements of the present disclosure relate to a flexible display substrate and a fabrication method thereof and a display device.

According to an aspect of the present disclosure, there is provided a flexible display substrate, which includes a plurality of light-emitting units. The light-emitting units includes an anode, a rhenium disulfide hole injection layer arranged on the anode, a light-emitting layer arranged on the rhenium disulfide hole injection layer, a single-layered molybdenum disulfide electron injection layer arranged on the light-emitting layer, and a cathode arranged on the single-layered molybdenum disulfide electron injection layer.

In an arrangement of the flexible display substrate according to the present disclosure, the light-emitting layer is a single-layered molybdenum disulfide light-emitting layer.

In another arrangement of the flexible display substrate according to the present disclosure, the flexible display substrate further includes a methylene blue dye layer arranged between the single-layered molybdenum disulfide light-emitting layer and the single-layered molybdenum disulfide electron injection layer.

In another arrangement of the flexible display substrate according to the present disclosure, the rhenium disulfide hole injection layer is a single-layer structure.

In another arrangement of the flexible display substrate according to the present disclosure, the anode is indium tin oxide (ITO) or poly(3,4-ethylenedioxythiophene)/polystyrolsulfon acid.

In another arrangement of the flexible display substrate according to the present disclosure, the poly(3,4-ethylenedioxythiophene)/polystyrolsulfon acid further includes dimethyl sulfoxide having a volume fraction of 0.4-0.8%, ethanediol having a volume fraction of 3-10%, and a fluorine-containing surfactant having a volume fraction of 2-6%.

In another arrangement of the flexible display substrate according to the present disclosure, the cathode includes any one or more of aluminum, magnesium, calcium, lithium fluoride, and magnesium fluoride.

In another aspect of the present disclosure, there is provided a method for preparing a flexible display substrate. The method includes forming a plurality of light-emitting units. The operation of forming the light-emitting units includes forming an anode, forming a rhenium disulfide hole injection layer on the anode, forming a light-emitting layer on the rhenium disulfide hole injection layer, forming a single-layered molybdenum disulfide electron injection layer on the light-emitting layer, and forming a cathode on the single-layered molybdenum disulfide electron injection layer.

In an arrangement of the method according to the present disclosure, the operation of forming an anode includes doping dimethyl sulfoxide having a volume fraction of 0.4-0.8%, ethanediol having a volume fraction of 3-10% and a fluorine-containing surfactant having a volume fraction of 2-6% into poly(3,4-ethylenedioxythiophene)/polystyrolsulfon acid.

In still another aspect of the present disclosure, there is provided a display device, which includes the foregoing flexible display substrate.

DETAILED DESCRIPTION

The technical solutions of the present disclosure are further described below with reference to specific arrangements. The scope of protection of the present disclosure is not limited to the following arrangements, and enumerating these examples are for exemplary purposes only but are not restrictive of the present disclosure in any way.

It is to be understood that the accompanying drawings disclosed herein are not drawn to scale according to actual devices and components. Shapes and thicknesses of the arrangements may likely be exaggerated in the accompanying drawings to clearly manifest features of the arrangements of the present disclosure. Moreover, the structures and the devices in the accompanying drawings are drawn schematically to clearly manifest features of the arrangements of the present disclosure.

Figure 1:
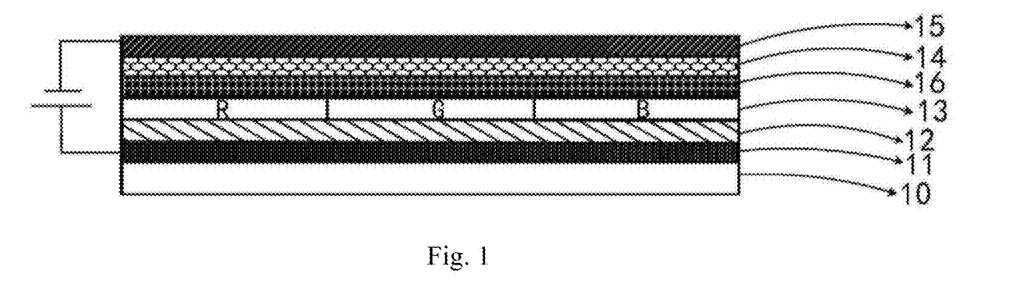
FIG. 1 is a schematic structural diagram of a flexible display substrate according to an arrangement of the present disclosure.

FIG. 1 is a schematic structural diagram of a flexible display substrate according to an arrangement of the present disclosure. As shown in FIG. 1, the flexible display substrate includes light-emitting units positioned on the flexible substrate 10. The light-emitting units includes an anode 11, a rhenium disulfide hole injection layer 12, a light-emitting layer 13, a single-layered molybdenum disulfide electron injection layer 14, and a cathode 15 from bottom to top.

The flexible substrate 10 may be a PET (polyethylene glycol terephthalate) substrate or a PI (polyimide) substrate and so on, such that the display device presents flexible features on the whole, and thus the flexible substrate 10 may be optionally twisted or stretched.

The anode 11 is arranged on the flexible substrate 10, a conductive anode having a high work function and suitably used as a flexible light-emitting device may be used in the flexible display substrate. In some arrangements, the anode may include an ITO or PEDOT series materials such as PEDOT:PSS (poly 3,4-ethylenedioxythiophene polystyrolsulfon acid). When the PEDOT:PSS is selected and used as the anode, dimethyl sulfoxide having a volume fraction of 0.4-0.8% may be doped into the PEDOT:PSS to further increase electrical conductivity, and ethanediol having a volume fraction of 3-10% and a fluorine-containing surfactant having a volume fraction of 2-6% may be doped into the PEDOT:PSS to increase wettability of the surface of the flexible substrate.

The rhenium disulfide hole injection layer 12 is arranged on the anode 11, the light-emitting layer 13 is arranged on the rhenium disulfide hole injection layer 12, and the single-layered molybdenum disulfide electron injection layer 14 is arranged on the light-emitting layer 13. That is, the light-emitting layer 13 is sandwiched between the rhenium disulfide hole injection layer 12 and the single-layered molybdenum disulfide electron injection layer 14, such that holes in the rhenium disulfide hole injection layer 12 and electrons in the single-layered molybdenum disulfide electron injection layer 14 may form electron-hole pairs in the light-emitting layer 13 to implement light emission.

The cathode 15 is arranged on the single-layered molybdenum disulfide electron injection layer 14, and uses materials having work functions as low as possible, for example, may include one or more of aluminum (Al), magnesium (Mg), calcium (Ca), lithium fluoride, magnesium fluoride and a mixture of lithium oxide and aluminum.

Molybdenum disulfide (MoS$_2$) is a hexagonal system layer structure. A single-layered molybdenum disulfide includes three layers of atomic layers. The upper layer and the lower layer are hexagonal planes of sulphur atoms and are separated by a molybdenum atom layer, thus forming a "sandwich" structure. Among these layers, each molybdenum atom and six sulphur atoms are bonded by covalent bonds to form a triangular prism coordination structure. Each sulphur atom and three molybdenum atoms form a triangular pyramid coordination structure by means of covalent bonds, a molybdenum atom at the edge of a single-layered molybdenum disulfide can only bond with four sulphur atoms, and each sulphur atom can only link with two molybdenum atoms, such that a lot of dangling bonds exist at the edge of the single-layered molybdenum disulfide, and thus the edge has high energy.

Multilayer or blocky molybdenum disulfide is formed by these single-layered "sandwich" structures by means of weak Van der Waals force. A distance between one layer and another layer is about 0.65 nm. Therefore, an innerlayer acting force is strong, but an interlayer interaction force is weak.

By calculating based on the first-principles, it is found that blocky molybdenum disulfide manifests as indirect semiconductor characteristics and has a band gap of about 1.2 eV. In the process when molybdenum disulfide changes from blocky material to a monolayer, its band gap is changed from an indirect band gap to a direct band gap as the number of layers is reduced. Particularly when the number of layers is reduced to a monolayer, its direct band gap transition reaches the maximum value of about 1.9 eV.

Rhenium disulfide (ReS$_2$) has characteristics of low lattice symmetry and weak interlayer coupling. These characteristics allow ReS$_2$ to show physical properties different from other two-dimensional transition metal chalcogenides, for example, anisotropy and maintaining a direct band gap in multilayer ReS$_2$. Therefore, the rhenium disulfide hole injection layer 12 in the flexible display substrate may be a single-layered structure, a double-layered structure, or a multilayered structure. However, to maintain stability of the electrical characteristics and the optical characteristics of the flexible display substrate when the flexible display substrate is optionally twisted or stretched and in consideration of simplifying processes and slimming the whole film layer, in some arrangements of the present disclosure, the single-layered rhenium disulfide hole injection layer is used.

The light-emitting layer may include an organic material or an inorganic material, for example, small molecule materials, polymer materials or organometallic complexes, etc. In some arrangements of the present disclosure, a single-layered molybdenum disulfide light-emitting layer is employed to reduce a motion trajectory of electrons in the light-emitting layer and to enhance light emission efficiency.

Figure 2:
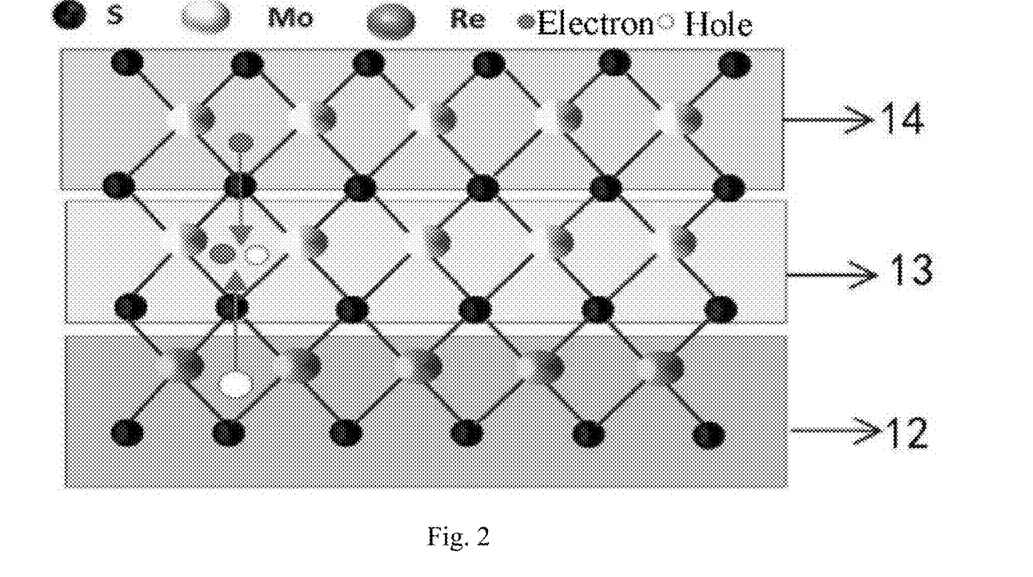
FIG. 2 is a schematic diagram showing light emission principles of a flexible display substrate according to an arrangement of the present disclosure.

The single-layered rhenium disulfide hole injection layer 12, the single-layered molybdenum disulfide light-emitting layer 13 and the single-layered molybdenum disulfide electron injection layer 14 stack to form the structure as shown in FIG. 2. As shown in FIG. 2, since both the single-layered molybdenum disulfide and the single-layered rhenium disulfide are direct band gap semiconductors and are flexible and compressible, after the single-layered rhenium disulfide hole injection layer 12 and the single-layered molybdenum disulfide electron injection layer 14 are stacked with the single-layered molybdenum disulfide light-emitting layer 13 disposed therebetween, the single-layered rhenium disulfide hole injection layer 12 and the single-layered molybdenum disulfide light-emitting layer 13 as well as the single-layered molybdenum disulfide light-emitting layer 13 and the single-layered molybdenum disulfide electron injection layer 14 are closely bonded together due to weak Van der Waals force between layers. At this moment, all the electrons and holes in the single-layered rhenium disulfide hole injection layer and the single-layered molybdenum disulfide electron injection layer are respectively in the same atomic layer instead of separate atomic layers. When the flexible display substrate is connected to a circuit, electric current is generated between the two layers, and the electrons can easily find the holes to form electron-hole pairs which are directly recombined to emit light. This structure can precisely control locations of the electrons and the holes in different atomic layers, enhance light utilization rate and increase light emission efficiency.

Based on photon energy formula: E=hv,
where E represents photon energy, whose unit is Joule (J); h represents a Planck constant, whose magnitude is about $6.63*10^{-34}$ and unit is Joule second (J·s); and v represents a light frequency, whose unit is hertz (Hz).

In the above formula, the unit of E is J, this unit is converted into electron volt, and the frequency and wavelength of light are substituted into the formula to obtain E=1240/λ, where λ represents the wavelength of light, whose unit is nanometer (nm).

The wavelength of red light is 630~760 nm, the wavelength of green light is 500~570 nm, and the wavelength of blue light is 430~450 nm. By substituting these wavelengths into the formula, E(red light)=1.97~1.63 eV, E(green light) =2.48~2.18 eV, and E(blue light)=2.88~2.76 eV.

In consideration of a fact that the single-layered molybdenum disulfide has small absorption effect within the range of visible spectrum (photon energy ranges from 1.64 eV to 3.19 eV), and the band gap of the single-layered molybdenum disulfide is 680 nm, therefore, the single-layered molybdenum disulfide does not respond to a light source whose wavelength is greater than 680 nm. As a consequence, a sensitized methylene blue dye layer 16 may be added between the molybdenum disulfide light-emitting layer 13 and the single-layered molybdenum disulfide electron injection layer 14, as shown in FIG. 1.

Methylene blue ($C_{16}H_{18}ClN_3S$) has excellent planarity, and S atoms in the dye molecules and Mo atoms and S atoms at a defect and a boundary of molybdenum disulfide can form S—Mo and S—S interactions, which is advantageous to transferring photon-generated carriers from the lowest unoccupied molecular orbital of the dye to a conduction band of molybdenum disulfide, such that the methylene blue has the best enhanced effect. In some arrangements, the thickness of the methylene blue dye layer 16 is 15-40 μm.

Figure 3A:
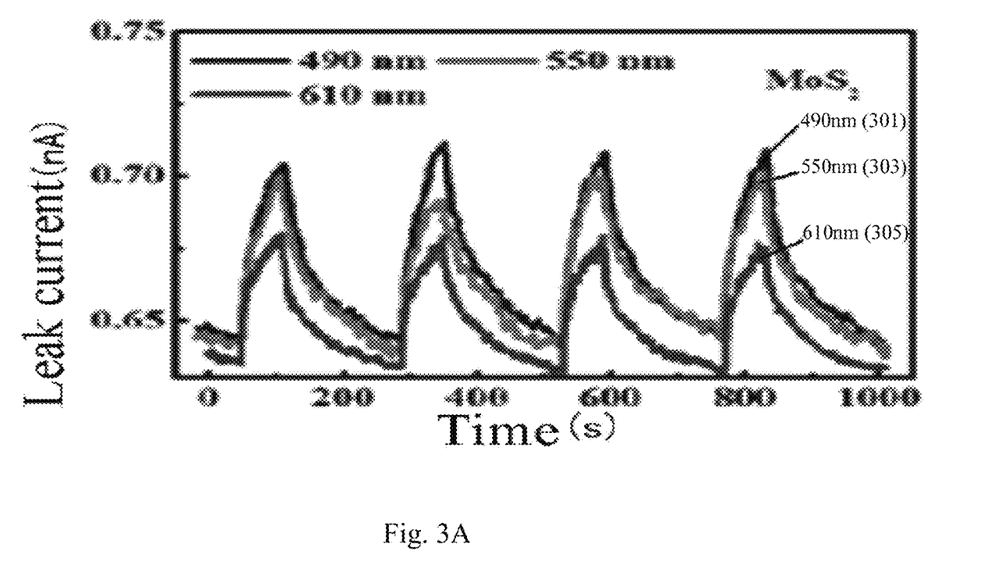
FIG. 3A is a light response I-T curve before methylene blue modifies a molybdenum disulfide device.
Figure 3B:
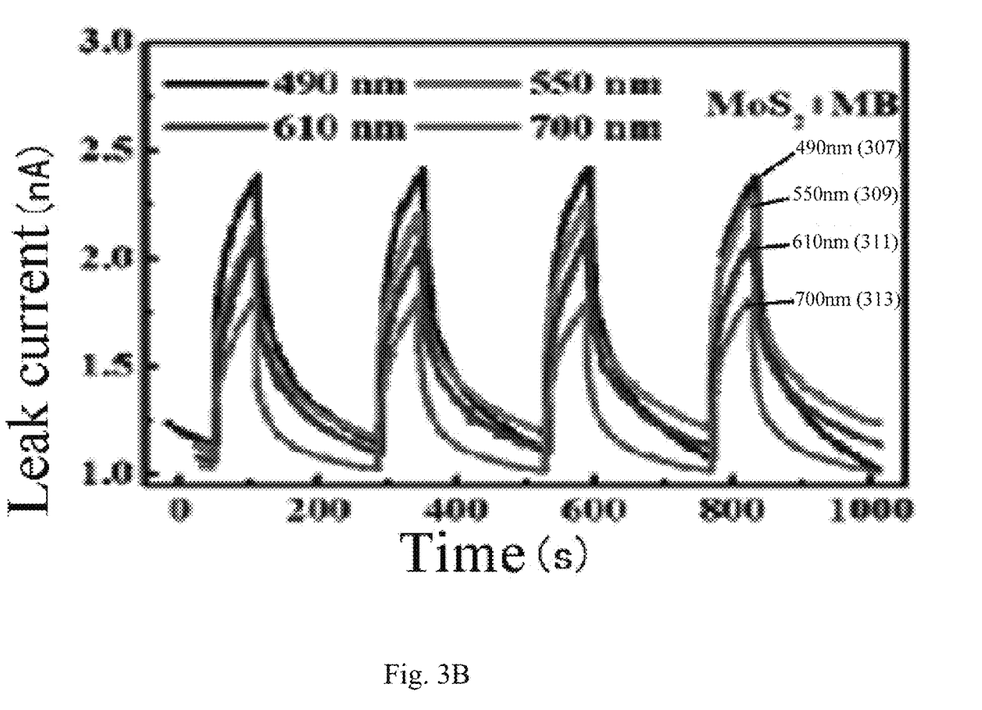
FIG. 3B is a light response I-T curve after methylene blue modifies a molybdenum disulfide device.
Figure 3C:
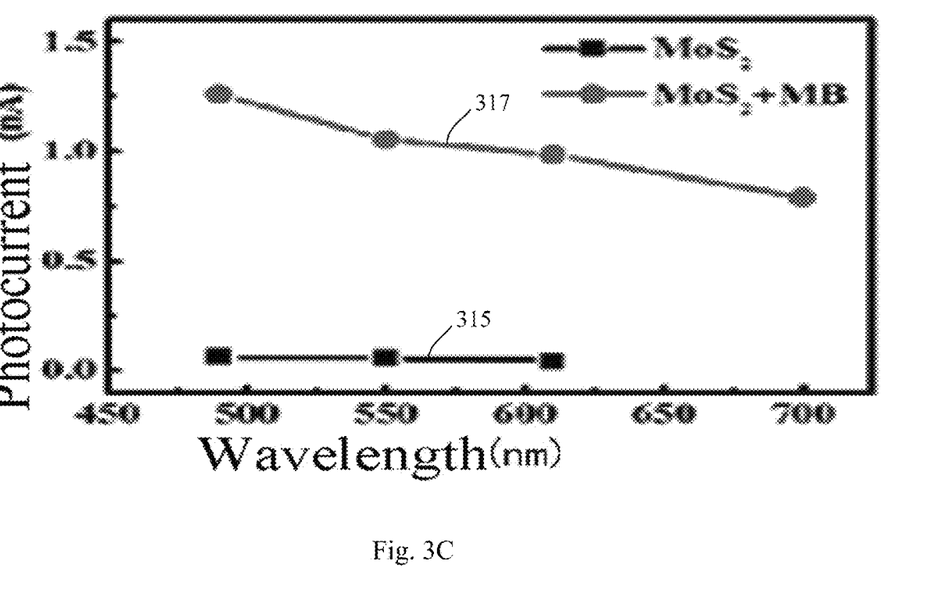
FIG. 3C is a schematic diagram showing that net photocurrent varies with wavelength of incident light before and after methylene blue modifies a molybdenum disulfide device.
Figure 3D:
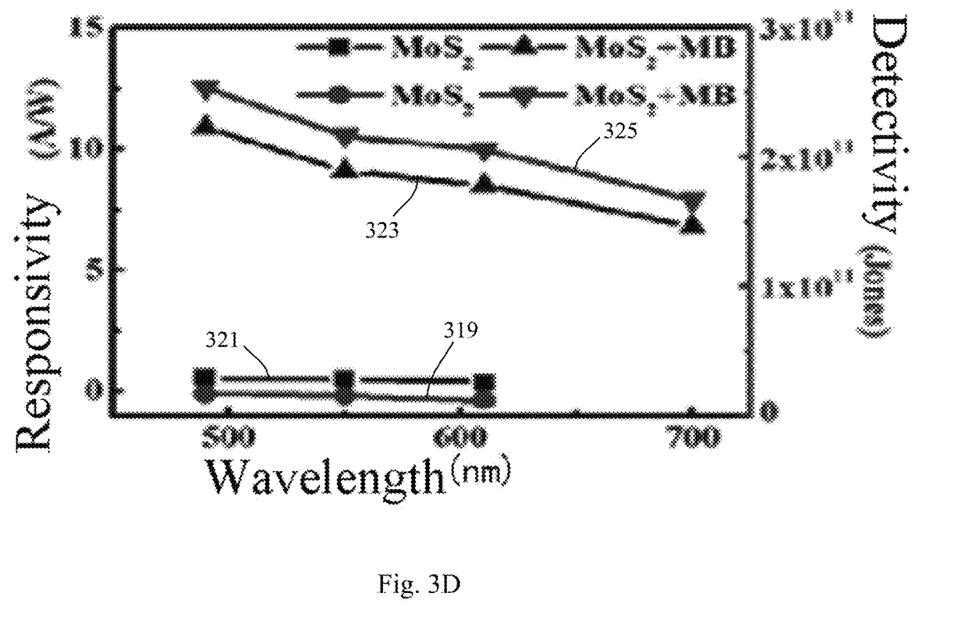
FIG. 3D is a schematic diagram showing that photoresponsivity and normalized detectivity vary with wavelength of incident light before and after methylene blue modifies a molybdenum disulfide device.

FIG. 3A is a number of light response I-T curves 301, 303, and 305 (on the X-axis of time and the Y-axis of leak current) with respect to wavelengths 490 nm, 550 nm, and 610 nm before methylene blue modifies a molybdenum disulfide device. FIG. 3B is a number of light response I-T curves 307, 309, 311, and 313 (on the X-axis of time and the Y-axis of leak current) with respect to various different wavelengths 490 nm, 550 nm, 610 nm, and 700 nm after methylene blue modifies the molybdenum disulfide device. The wavelength is inversely proportional to the height of the curve corresponding to the wavelength at each peak. FIG. 3C is a schematic diagram showing that net photocurrent varies with wavelength of incident light before (curve 315) and after (curve 317) methylene blue modifies the molybdenum disulfide device. FIG. 3D is a schematic diagram showing that photoresponsivity varies with wavelength of incident light before (curve 319) and after (curve 321) methylene blue modifies the molybdenum disulfide device, and normalized detectivity varies with wavelength of incident light before (curve 323) and after (curve 325) methylene blue modifies the molybdenum disulfide device.

As shown in FIGS. 3A-D and in conjunction with FIG. 1, after the methylene blue dye layer 16 is added between the molybdenum disulfide light-emitting layer 13 and the single-layered molybdenum disulfide electron injection layer 14, in one aspect, the photoresponsivity of the molybdenum disulfide is enhanced. In another aspect, the absorption spectrum of the molybdenum disulfide is broadened, such that the molybdenum disulfide has good responsivity in different wavelengths, for example, the molybdenum disulfide still has good responsivity in a wavelength of 700 nm.

The light-emitting units include a plurality of red light-emitting units, a plurality of blue light-emitting units, and a plurality of green light-emitting units. The light-emitting layers of the red light-emitting units, the blue light-emitting units and the green light-emitting units may have different band-gap energies to emit light of different wavelengths. For example, the band-gap energy of the light-emitting layer of the red light-emitting unit corresponds to the energy of red light, and thus the red light-emitting unit can emit red light (R). The band-gap energy of the light-emitting layer of the green light-emitting unit corresponds to the energy of green light, and thus the green light-emitting unit can emit green light (G). The band-gap energy of the light-emitting layer of the blue light-emitting unit corresponds to the energy of blue light, and thus the blue light-emitting unit can emit blue light (B).

The flexible display substrate of the present disclosure can still maintain electrical characteristics and optical characteristics basically unchanged while the flexible display substrate is optionally twisted or stretched. This is mainly because the single-layered rhenium disulfide has lower weak interlayer coupling and a unique twisted 1T structure, and $ReS_2$ may always maintain a direct band gap due to weak interlayer coupling.

Figure 4A:
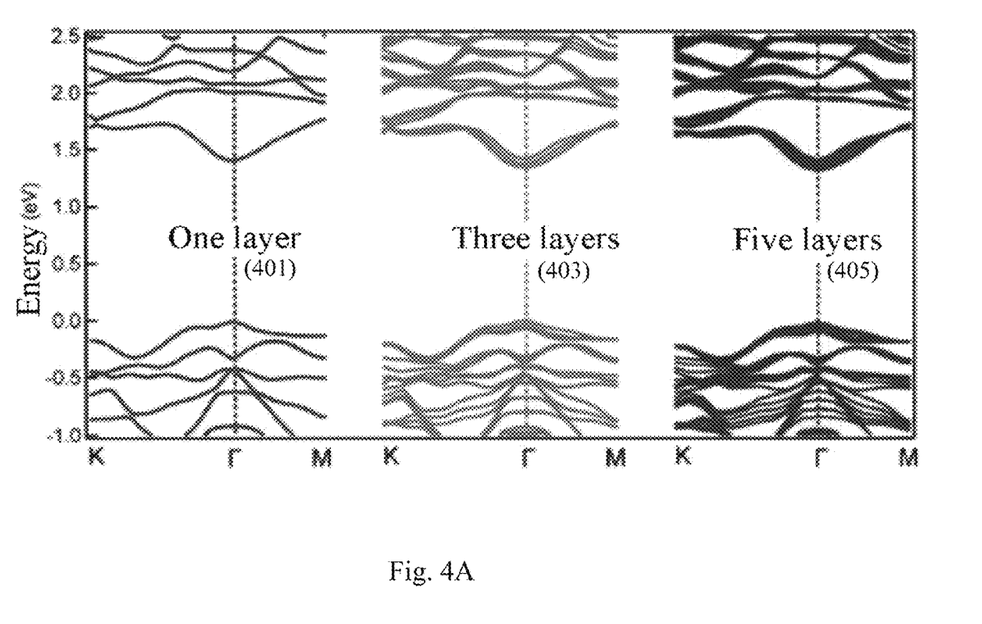
FIG. 4A is a diagram illustrating a band gap of one layer of rhenium disulfide, three layers of rhenium disulfide and five layers of rhenium disulfide.

FIG. 4A is a diagram illustrating a band gap of one layer of rhenium disulfide, three layers of rhenium disulfide and five layers of rhenium disulfide. As shown in FIG. 4A, the energy band structures of monolayer (401) and multilayer $ReS_2$ (403 and 405) are respectively calculated by using the first-principles. It can be found from the energy band structures monolayer or multilayer $ReS_2$ are direct band gap semiconductors. The energy band structures of monolayer (401), three-layer (403) and five-layer $ReS_2$ (405) hardly have difference, but direct band gaps thereof are slightly different. The band gaps of the monolayer, three-layer and five-layer $ReS_2$ respectively are 1.44 eV, 1.40 eV and 1.35 eV. The energy band structure of $ReS_2$ is insensitive to number of layers, which also verifies that the interlayer coupling of $ReS_2$ is indeed weak. By calculating based on the first-principles, detailed vibration modes of all the 18 primary Raman peaks of rhenium disulfide may be obtained through analysis. The 18 primary Raman peaks mainly come from low lattice symmetry of rhenium disulfide.

Figure 4B:
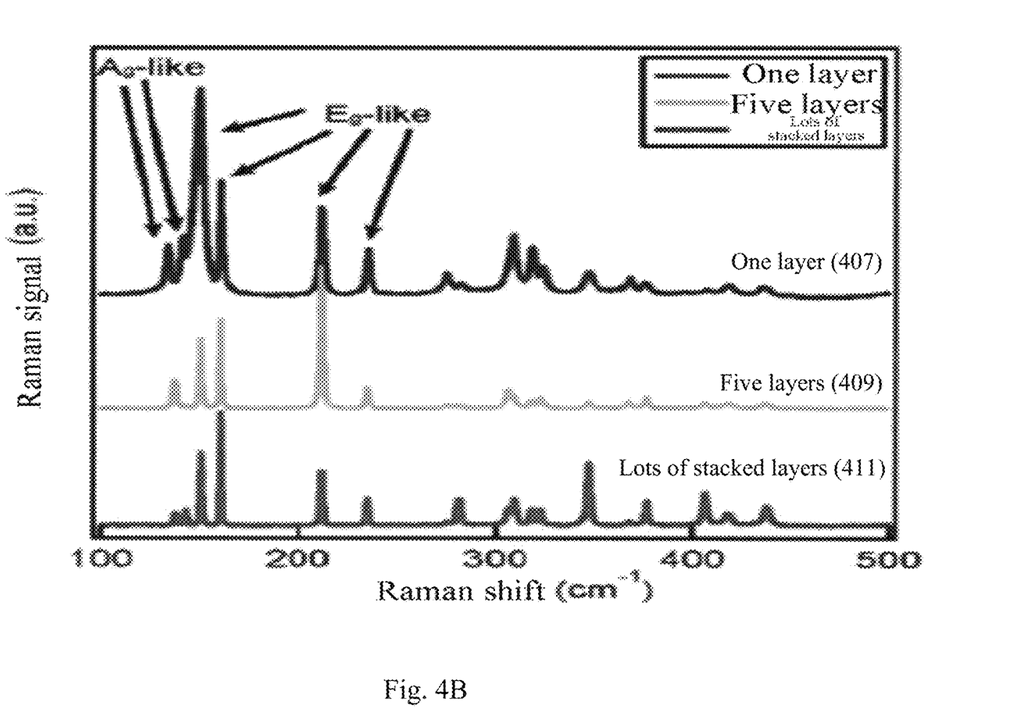
FIG. 4B is a Raman spectrogram of one layer of rhenium disulfide, five layers of rhenium disulfide and lots of stacked layers of rhenium disulfide.

FIG. 4B is a Raman spectrogram of one layer of rhenium disulfide (407), five layers of rhenium disulfide (409) and a lot of stacked layers of rhenium disulfide (411). As shown in FIG. 4B, two low frequency peaks are in an Ag-like mode, whose locations are 136.8 cm$^{-1}$ and 144.5 cm$^{-1}$ respectively. The two peaks correspond to an out-of-plane vibration mode of a Re atom. Furthermore, there are four peaks in an Eg-like mode, whose locations are 153.6 cm$^{-1}$, 163.4 cm$^{-1}$, 218.2 cm$^{-1}$ and 238.1 cm$^{-1}$, corresponding to an in-plane vibration mode of the Re atom. By measuring the Raman spectrums of ReS$_2$ samples of different number of layers, it is proved again that the interlayer coupling of ReS$_2$ is weak.

Moreover, there is no specific proportional relation between the intensity of each peak and all the samples. This is because a relative angle θ between a vibration direction of a light source and a lattice direction of ReS$_2$ is not fixed. ReS$_2$ has anisotropy, and thus the measured peak intensity of the Raman peak may vary with θ.

Figure 5A:
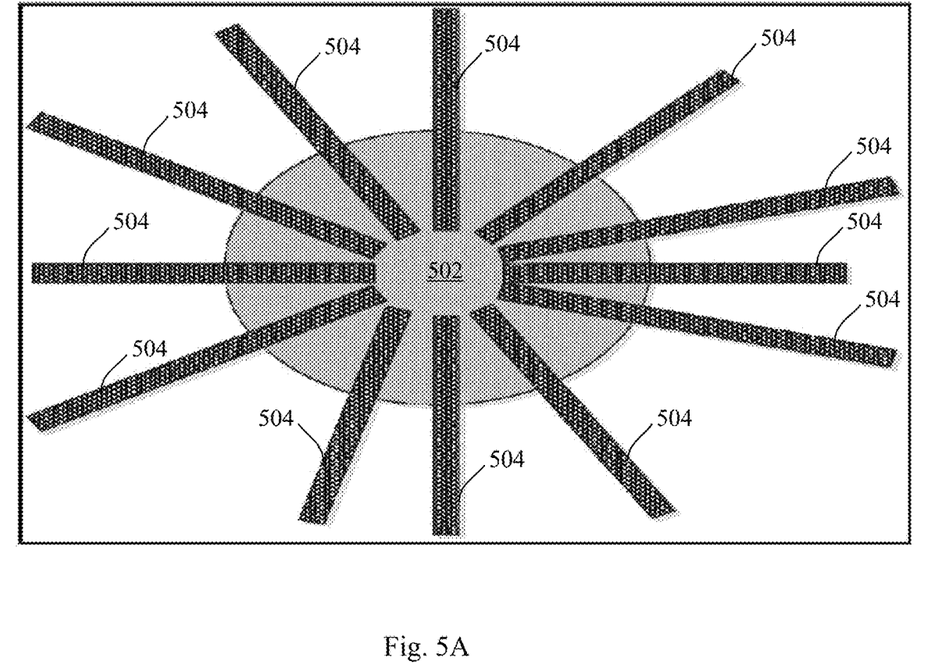
FIG. 5A is a schematic diagram illustrating a location between a ReS$_2$ layer and a plurality pairs of electrodes when analyzing electrical anisotropy of ReS$_2$.
Figure 5B:
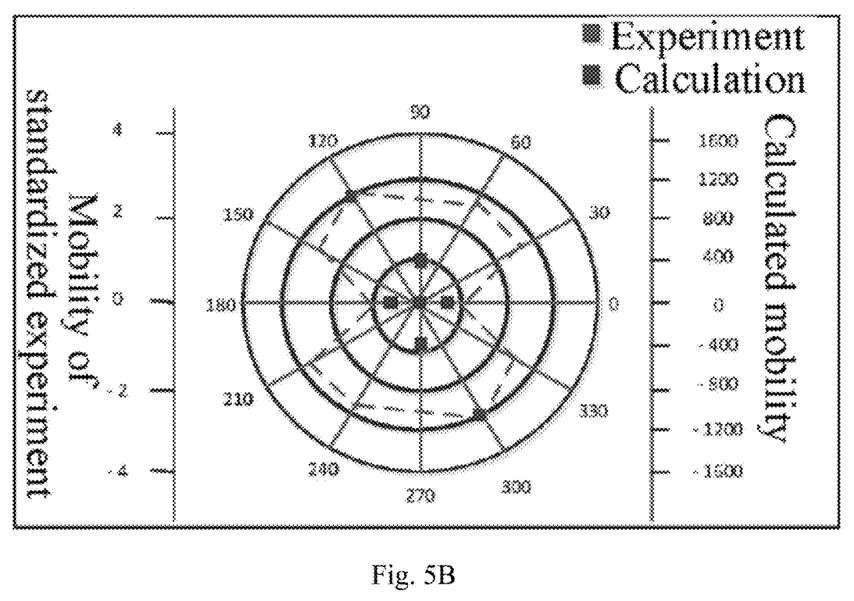
FIG. 5B illustrates a field effect mobility between the electrodes in FIG. 5A displayed in the form of polar coordinates.

FIG. 5A is a schematic diagram illustrating a location between a ReS$_2$ layer 502 and a plurality pairs of electrodes 504 when analyzing electrical anisotropy of ReS$_2$. As shown in FIG. 5A, to make a systematic study on the electrical anisotropy of ReS$_2$, a ReS$_2$ thin layer 502 may be etched into a disc shape by using electron beam lithography in combination with an ICP spectrometer, and electrodes 504 are etched at the edge of the disc by using electron beam lithography. As shown in the illustrated arrangement of FIG. 5A, there are six pairs of electrodes (12 electrodes in total), and an included angle between two adjacent electrodes is 30°. Transfer curves between the six pairs of electrodes (an electrode spacing being 4.5 µm) whose included angles are 180° are respectively measured. A field effect mobility (e.g., a normalized mobility) between each pair of electrodes is calculated based on the transfer curves, and the obtained numerical values are drawn in the form of polar coordinates. Each pair of electrodes correspond to two data points with a difference of 180° in a polar coordinates, as shown in FIG. 5B.

The angle corresponding to the minimum mobility is defined as 0° (or 180°). As a reference, the mobilities at different angles are different. As can be seen from FIG. 5B, rhenium disulfide has anisotropy. Therefore, the electrical and optical characteristics of the flexible display substrate remain unchanged while the flexible display substrate is twisted or stretched.

Figure 6:
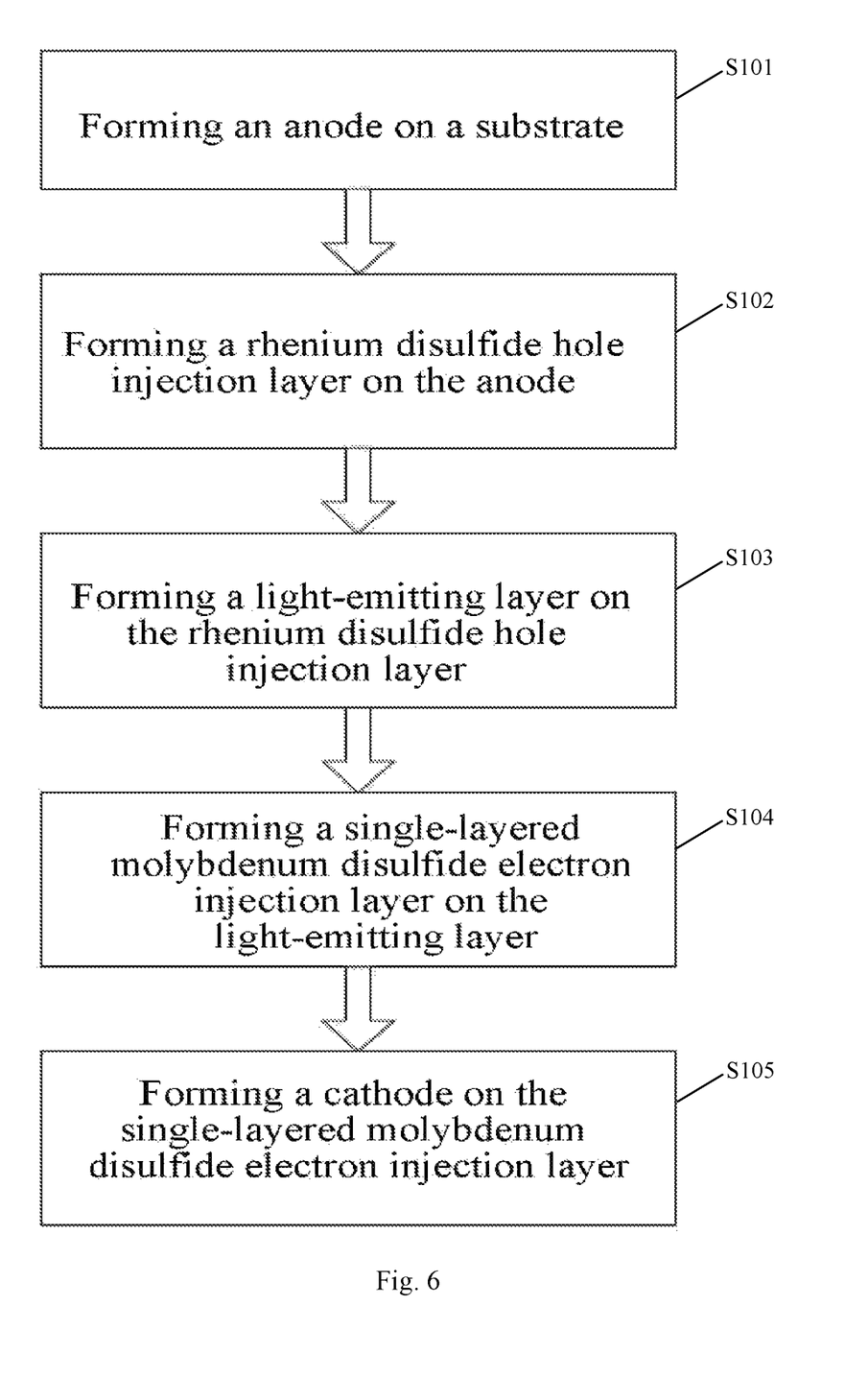
FIG. 6 is a process flow diagram of preparing a flexible display substrate according to an arrangement of the present disclosure.

FIG. 6 is a process flow diagram of preparing a flexible display substrate according to an arrangement of the present disclosure. As shown in FIG. 6, the flexible display substrate of the present disclosure may be prepared by following blocks.

First in block S101, an anode is formed on a flexible substrate. Before the anode is formed, the flexible substrate may be cleaned by using a suitable reagent and then dried. The anode may be formed on the flexible substrate or an injection layer by adopting suitable processes such as a sputtering process, an electron beam evaporation process, a thermal evaporation process, a chemical vapor coating process, or a spraying thermal cracking process, etc.

When the PEDOT:PSS is selected and used as the anode, dimethyl sulfoxide having a volume fraction of 0.4-0.8% may be doped into the PEDOT:PSS to further increase electrical conductivity, and ethanediol having a volume fraction of 3-10% and a fluorine-containing surfactant having a volume fraction of 2-6% may be doped into the PEDOT:PSS to increase wettability of the surface of the flexible substrate.

The fluorine-containing surfactant used in the present disclosure may be an anionic fluorine-containing surfactant, a cationic fluorine-containing surfactant, an amphoteric fluorine-containing surfactant, or a nonionic fluorine-containing surfactant. The anionic fluorine-containing surfactant includes carboxylates such as $C_nF_{2n+1}COONa$ and $C_nF_{2n+1}(CH_2)_mCOONa$, sulphonates such as $C_nF_{2n+1}SO_3Na$ and $C_nF_{2n+1}C_6H_4SO_3Na$, sulfuric acid ester salt such as $C_nF_{2n+1}(CH_2)_mOSO_3Na$, and phosphate ester salts such as $C_nF_{2n+1}(CH_2)_mOP(O)(OH)_2$. The cationic fluorine-containing surfactant includes quaternary ammonium salts such as $C_nF_{2n-1}(CH_2)_mON^+(CH_3)I^-$ and amine oxides such as $C_nF_{2n+1}(CH_2)_mCOOCH_2N(\to O)(CH_3)_2$. The amphoteric fluorine-containing surfactant includes glycine betaine such as $C_nF_{2n+1}CONH(CH_2)_3O(CH_2)_2N^+(CH_3)_2COO^-$. The nonionic fluorine-containing surfactant includes polyethylene glycol such as $C_nF_{2n+1}CH_2O(CH_2CH_2O)_mH$. The m and the n in the above chemical formulas are positive integers.

Next, in block S102, a rhenium disulfide hole injection layer is formed on the anode. In some arrangements of the present disclosure, the formed rhenium disulfide hole injection layer is a single-layer structure.

Next, in block S103, a light-emitting layer is formed on the rhenium disulfide hole injection layer. The light-emitting layer may include an organic material or an inorganic material, for example, small molecule materials, polymer materials or organometallic complexes, etc. The light-emitting layer may be formed by vacuum thermal evaporation, spin coating, ink jetting, laser transfer printing or screen printing, etc. In some arrangements of the present disclosure, the single-layered molybdenum disulfide light-emitting layer is used as the light-emitting layer.

Next, in block S104, a single-layered molybdenum disulfide electron injection layer is formed on the light-emitting layer.

In block S105, a cathode is formed on the single-layered molybdenum disulfide electron injection layer. The cathode may be formed by a sputtering process, an electron beam evaporation process, a thermal evaporation process, a chemical vapor coating process, a spraying thermal cracking process, etc.

The single-layered rhenium disulfide hole injection layer, the single-layered molybdenum disulfide light-emitting layer and the single-layered molybdenum disulfide electron injection layer may be formed by using the following methods: methods of "from up to down" such as micromechanical force exfoliation, lithium ion intercalation, liquid phase ultrasonic exfoliation, a laser method and an annealing layer-by-layer thinning method or the like, and methods of "from bottom to top" such as sulfurizing and reducing molybdenum method, sulfurizing molybdenum dioxide method, sulfurizing molybdenum trioxide method, sulfurizing molybdenum pentoxide method, and pyrolysis method, etc.

When the molybdenum disulfide is used as the light-emitting layer, to enhance photoresponsivity of the molybdenum disulfide and broaden absorption spectrum of the molybdenum disulfide, a methylene blue dye layer also may be formed between the molybdenum disulfide light-emitting layer and the single-layered molybdenum disulfide electron injection layer. For example, the methylene blue dye layer may be formed by drop casting, and then the device is dried such that moisture adsorbed onto the molybdenum disulfide can be evaporated as quickly as possible.

Specifically, the above fabrication method includes following operations.

The flexible PET substrate is subjected to ultrasonic cleaning for 30 min by using a detergent, acetone and ethanol in sequence, and then the flexible PET substrate is dried for more than 5 h in a thermostatic drier box at a temperature of 110° C.

Next, 80 nm-thick high-conductivity PEDOT:PSS doped with dimethyl sulfoxide of a volume fraction of 0.5%, ethanediol of a volume fraction of 5% and a fluorine-containing surfactant of a volume fraction of 3% is spin-coated on the flexible PET substrate, and then is annealed for 15 min at the temperature of 70° C. on a heater table.

Next, the single-layered rhenium disulfide hole injection layer and the single-layered molybdenum disulfide light-emitting layer (having different band-gap energies) are sequentially formed on the PEDOT:PSS, then 5 μL sensitized methylene blue dye solution having a concentration of 1 mM is directly formed onto molybdenum disulfide of the single-layered molybdenum disulfide light-emitting layer by drop-casting, and then the device is dried for 10 min in a drying oven at a temperature of 70° C.

Next, a single-layered molybdenum disulfide electron injection layer is formed on the methylene blue dye layer.

An Al cathode layer is coated on the single-layered molybdenum disulfide electron injection layer, and the cathode and the anode of the flexible display substrate are respectively connected to the negative electrode and the positive electrode of a power supply.

The display device of the present disclosure includes the above flexible display substrate, and the display device may be any product or component having a display function, such as a mobile phone, a tablet computer, a TV set, a display, a notebook computer, a digital photo frame, a navigation device and so on.

Of course, the display device of the present disclosure also has structures such as an outer frame of a conventional display device.

In conclusion, the flexible display substrate of the present disclosure uses rhenium disulfide and single-layered molybdenum disulfide as a carrier injection layer, which not only enhances light emission efficiency but also maintains electrical characteristics and optical characteristics of the flexible display substrate basically unchanged while the flexible display substrate is optionally twisted or stretched, and thus application fields of the flexible display device are broadened.

Those skilled in the art should notice that the arrangements described in the present disclosure are merely exemplary, and various other substitutions, modifications and improvements may be made within the scope of the present disclosure. Therefore, the present disclosure is not limited to the above arrangements and is merely limited by claims.

What is claimed is:

1. A flexible display substrate, comprising a plurality of light-emitting units, wherein the light-emitting units comprises:
   an anode;
   a rhenium disulfide hole injection layer arranged on the anode;
   a light-emitting layer arranged on the rhenium disulfide hole injection layer;
   a single-layered molybdenum disulfide electron injection layer arranged on the light-emitting layer; and
   a cathode arranged on the molybdenum disulfide electron injection layer.

2. The flexible display substrate according to claim 1, wherein the light-emitting layer is a single-layered molybdenum disulfide light-emitting layer.

3. The flexible display substrate according to claim 2, further comprising a methylene blue dye layer arranged between the single-layered molybdenum disulfide light-emitting layer and the single-layered molybdenum disulfide electron injection layer.

4. The flexible display substrate according to claim 1, wherein the rhenium disulfide hole injection layer is a single-layer structure.

5. The flexible display substrate according to claim 1, wherein a material of the anode comprises indium tin oxide or poly(3,4-ethylenedioxythiophene) polystyrene sulfonate.

6. The flexible display substrate according to claim 5, wherein the poly(3,4-ethylenedioxythiophene) polystyrene sulfonate further comprises dimethyl sulfoxide having a volume fraction of 0.4-0.8%, ethanediol having a volume fraction of 3-10%, and a fluorine-containing surfactant having a volume fraction of 2-6%.

7. The flexible display substrate according to claim 1, wherein a material of the cathode comprises one or more of aluminum, magnesium, calcium, lithium fluoride, and magnesium fluoride.

8. A method for preparing a flexible display substrate, comprising forming a plurality of light-emitting units, wherein an operation of forming the plurality of light-emitting units comprises:
   forming an anode;
   forming a rhenium disulfide hole injection layer on the anode;
   forming a light-emitting layer on the rhenium disulfide hole injection layer;
   forming a single-layered molybdenum disulfide electron injection layer on the light-emitting layer; and
   forming a cathode on the single-layered molybdenum disulfide electron injection layer.

9. The method according to claim 8, wherein the operation of forming an anode comprises doping dimethyl sulfoxide having a volume fraction of 0.4-0.8%, ethanediol having a volume fraction of 3-10% and a fluorine-containing surfactant having a volume fraction of 2-6% into poly(3,4-ethylenedioxythiophene) polystyrene sulfonate.

10. A display device, comprising a flexible display substrate, wherein the flexible display substrate comprises a plurality of light-emitting units, and the light-emitting units comprises:
    an anode;
    a rhenium disulfide hole injection layer arranged on the anode;
    a light-emitting layer arranged on the rhenium disulfide hole injection layer;
    a single-layered molybdenum disulfide electron injection layer arranged on the light-emitting layer; and
    a cathode arranged on the molybdenum disulfide electron injection layer.

11. The display device according to claim 10, wherein the light-emitting layer is a single-layered molybdenum disulfide light-emitting layer.

12. The display device according to claim 11, wherein the flexible display substrate further comprises a methylene blue dye layer arranged between the single-layered molybdenum disulfide light-emitting layer and the single-layered molybdenum disulfide electron injection layer.

13. The display device according to claim 10, wherein the rhenium disulfide hole injection layer is a single-layer structure.

14. The display device according to claim 10, wherein a material of the anode comprises indium tin oxide or poly (3,4-ethylenedioxythiophene) polystyrene sulfonate.

15. The display device according to claim 14, wherein the poly(3,4-ethylenedioxythiophene) polystyrene sulfonate further comprises dimethyl sulfoxide having a volume fraction of 0.4-0.8%, ethanediol having a volume fraction of 3-10%, and a fluorine-containing surfactant having a volume fraction of 2-6%.

16. The display device according to claim 10, wherein a material of the cathode comprises one or more of aluminum, magnesium, calcium, lithium fluoride, and magnesium fluoride.

* * * * *